United States Patent [19]

Diehl et al.

[11] Patent Number: 4,904,339

[45] Date of Patent: Feb. 27, 1990

[54] VERTICAL SPRAY ETCH REACTOR AND METHOD

[75] Inventors: Paulo A. Diehl, Cupertino; William R. Bjorge, Los Gatos; Norvell J. Nelson, Palo Alto, all of Calif.

[73] Assignee: PSI Star, Fremont, Calif.

[21] Appl. No.: 358,551

[22] Filed: May 26, 1989

[51] Int. Cl.$^4$ .............. C23F 1/02; B44C 1/22; C03C 15/00; C03C 25/06

[52] U.S. Cl. .................. 156/640; 156/345; 156/642; 156/656; 156/659.1; 156/666; 156/902

[58] Field of Search .............. 156/345, 640, 641, 642, 156/656, 659.1, 666, 901, 902; 134/3, 34, 103, 198, 200

[56] References Cited

U.S. PATENT DOCUMENTS

| | | | |
|---|---|---|---|
| 4,017,343 | 4/1977 | Haas | 156/642 |
| 4,371,422 | 2/1983 | Eidschun | 156/640 |
| 4,376,009 | 3/1983 | Kunz | 156/640 |
| 4,454,003 | 6/1984 | Fishman et al. | 156/640 |
| 4,482,425 | 11/1984 | Battey | 156/642 X |
| 4,497,687 | 2/1985 | Nelson | 156/666 X |
| 4,545,850 | 10/1985 | Nelson | 156/642 |
| 4,620,894 | 11/1986 | Gurian et al. | 156/345 |

*Primary Examiner*—William A. Powell
*Attorney, Agent, or Firm*—Flehr, Hohbach, Test, Albritton & Herbert

[57] ABSTRACT

Vertical spray etch reactor and method in which a nitric acid etching solution is sprayed onto an upright workpiece in the form of low impact, large drops to produce a gentle sheeting flow of the etching solution down the workpiece. The solution is sprayed in a generally trapezoidal pattern with the greater portion of solution being sprayed onto the upper portion of the workpiece. The etching solution is delivered to the spray nozzles by a low shear positive displacement pump. As the workpiece leaves the etch chamber, it is sprayed with a solution to remove the etching solution and dissolved copper and to adsorb gaseous by-products from the etching reaction. The rinsing solution is collected and utilized to replenish the etching solution. The workpiece receives additional rinsing in a third chamber, and gases are exhausted from the system through an exhaust vent in the third chamber. Air is introduced into the etch chamber to move the gaseous by-products toward the exhaust vent.

28 Claims, 1 Drawing Sheet

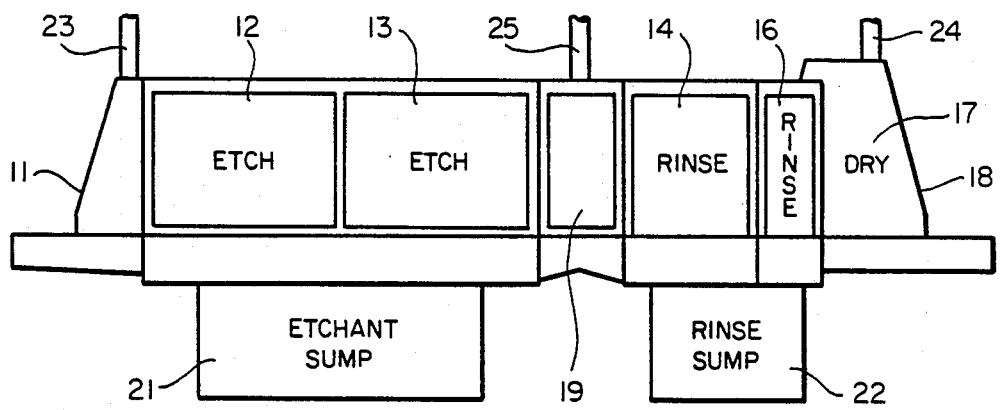
FIG_1
(PRIOR ART)
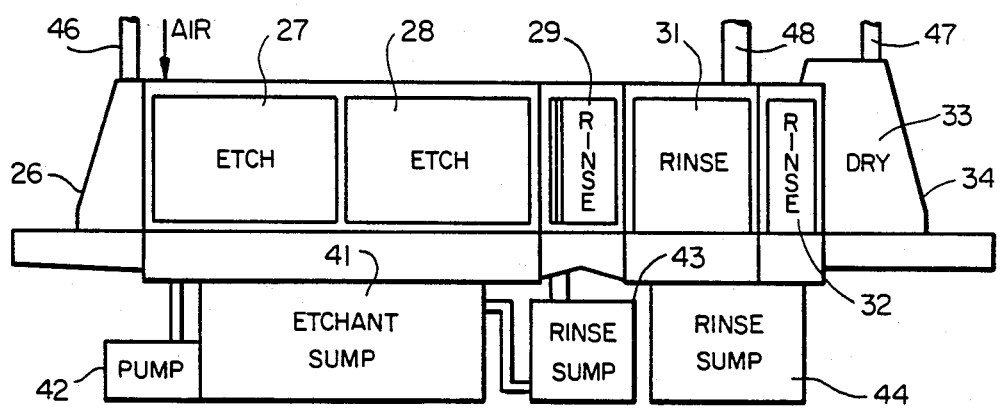
FIG_2
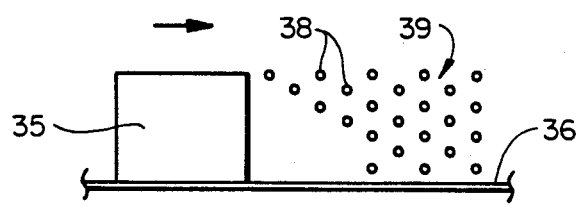
FIG_3

VERTICAL SPRAY ETCH REACTOR AND METHOD

This invention pertains generally to the etching of copper and other metals and, more particularly, to a vertical spray etch reactor and method for removing copper from a printed circuit board or other workpiece with a nitric acid etching solution.

U.S. Pat. No. 4,497,687 discloses a process for etching copper foil with an aqueous solution of nitric acid in the manufacture of printed circuit boards. U.S. Pat. No. 4,545,850 discloses a somewhat similar process in which the etching solution is regenerated by adding sulfuric acid to the solution.

In the processes disclosed in these patents, nitric acid reacts with copper according to the relationship $$3Cu + 8HNO_3 = 3Cu(NO_3)_2 + 2NO + 4H_2O$$

with the nitric acid serving both as an oxidant and as an anion source for the dissolved copper. The dissolved copper is removed by adding sulfuric acid to precipitate the copper according to the relationship $$3Cu(NO_3)_2 + 3H_2SO_4 = 3CuSO_4 + 6HNO_3.$$

To protect the etch resist and the substrate board from attack by the nitric acid, either copper nitrate or sulfuric acid is included in the etching solution. When sulfuric acid is employed the consumption of nitric acid is reduced, and the reaction proceeds according to the relationship $$3Cu + 2HNO_3 + 3H_2SO_4 = 3CuSO_4 + 2NO + 4H_2O.$$

Copper is removed as the sulfate pentahydrate according to the relationship $$CuSO_4 + 5H_2O = CuSO_4 \cdot 5H_2O.$$

The copper nitrate or sulfuric acid increases the reactivity of nitric acid toward copper such that reasonable reaction rates can be achieved with much lower concentrations of nitric acid than would otherwise be required. Thus, the amount of nitric acid can be kept to levels which do not react with the substrates or organic resists. Certain metal resists can also be utilized with these etchants, especially a tin-nickel alloy.

A polymer is included in the etching solution to control the surface reaction rate and to enhance the anisotropy of the etch. One suitable polymer is a polyacrylamide which is soluble in water and has a high molecular weight. The amount of polymer employed is on the order of 0.05% (volume) of the solution. Suitable polyacrylamides include Hercules Reten 520 (a neutral polyacrylamide having a high molecular weight), and American Cyanamid's Magnifloc 2535 CH polyacrylamide.

A surfactant can also be included in the etching solution to reduce surface tension and facilitate the movement of nitric oxide bubbles from the surface of the copper. The nitric oxide gas is generated during the etching process, and the surfactants serve to keep the bubble size small and prevent the bubbles from bridging between resist lines and blocking etching between the lines. Only a very small amount of surfactant is required, e.g. 0.1 to 0.2% (volume) of the etching solution. Suitable surfactants include surfactants such as Miranol's J2M-SF-conc.

When these nitric acid etching solutions have been employed in spray etchers, the results have not always been consistent and reproducible, and it has not been feasible to use this technique to produce circuit boards on a commercial scale, even though the nitric acid chemistry has been found to produce exceptionally good results in other types of reactors. One problem with spray etchers heretofore provided is that they are designed to provide a finely divided spray having a high impact velocity. Some etchants are sludging and need to physical force of a high impact spray in order to function, and they are typically applied at high pressures, e.g. 30 psi, which are produced with centrifugal pumps. Both the high impact velocity and the use of centrifugal pumps have been found to cause problems with nitric acid solutions.

Another problem encountered with spray etchers of the prior art is the disposal of the used etching solution, disposal of the dissolved copper or other material removed from the workpiece, and disposal of gaseous by-products of the etching process.

It is in general an object of the invention to provide a new and improved reactor and method for removing copper from substrates in the manufacture of printed circuit boards.

Another object of the invention is to provide a reactor and method of the above character which overcome the limitations and disadvantages experienced in using nitric acid etching solutions in spray etchers of the prior art.

Another object of the invention is to provide a reactor and method of the above character which minimizes the amount of noxious reaction by-products discharged from the reactor.

These and other objects are achieved in accordance with the invention by spraying a nitric acid etching solution onto an upright workpiece in the form of low impact, large drops to produce a gentle sheeting flow of the etching solution down the workpiece. The solution is sprayed in a generally trapezoidal pattern with the greater portion of solution being sprayed onto the upper portion of the workpiece. The etching solution is delivered to the spray nozzles by a low shear positive displacement pump. As the workpiece leaves the etch chamber, it is sprayed with a solution to remove the etching solution and dissolved copper and to adsorb gaseous by-products from the etching reaction. The rinsing solution is collected and utilized to replenish the etching solution. The workpiece receives additional rinsing in a third chamber, and gases are exhausted from the system through an exhaust vent in the third chamber. Air is introduced into the etch chamber to move the gaseous by-products toward the exhaust vent.

FIG. 1 is a diagrammatic side elevational view of a prior art spray etch reactor.

FIG. 2 is a view similar to FIG. 1 of one embodiment of a vertical spray etch reactor according to the invention.

FIG. 3 is a diagrammatic view illustrating a preferred pattern of spray nozzles for use in the embodiment of FIG. 2.

The prior art reactor illustrated in FIG. 1 has an entrance port 11, etch chambers 12, 13, rinse chambers 14, 16, a dryer 17, and an exit port 18, with a transfer chamber 19 between the etch chambers and the rinse chambers. Workpieces are conveyed through the reactor from the entrance port to the exit port in an upright position, and nozzles (not shown) arranged in generally rectangular patterns spray an etching solution against the sides of the workpieces in the etch chambers. Sumps 21, 22 collect the used solutions from the etching and rinsing chambers as well as the dissolved copper or other material from the workpieces. Gases are exhausted from the system through exhaust vents 23-25 at the entrance and exit ports and in the transfer chamber. Reactors of this type are available from Circuit Chemistry Corporation, Maple Plain, Minnesota, under the trade name Vertical Integrated Processor and the trademark VIP, and from Rich Automation, Salt Lake City, Utah, under the trade name Vertical Conveyor Module and the trademark VCM.

The reactor illustrated in FIG. 2 is similar to the prior art reactor of FIG. 1 in that it has an entrance port 26, etch chambers 27, 28, a transfer chamber 29, rinse chambers 31, 32, a dryer 33 and an exit port 34. As in the prior art reactor, printed circuit boards 35 or other generally planar workpieces are conveyed through the reactor from the entrance port to the exit port in an upright position. The boards travel single file on a longitudinally extending conveyor 36 which grips the lower edge portions of the boards, with the surfaces of the boards facing sideways, or parallel to the longitudinal axis.

Means is provided for spraying the boards in the etch chambers to produce a gentle sheeting flow of the etching solution down the boards as they travel through the chambers. This means includes a plurality of inwardly facing spray nozzles 38 arranged in groups 39 on opposite sides of the conveyor in each of the chambers. The nozzle in each group are arranged in a generally trapezoidal pattern with a greater number of nozzles being provided toward the entrance end of the chamber and the upper edges of the boards. This pattern applies additional etchant to the upper portions of the boards as they enter the chambers, and as this etchant runs down the boards, it increases the overall uniformity of the etch in the vertical direction.

Nozzles 38 are low impact nozzles which atomize the etching solution to produce relatively large drops at a spray pressure on the order of 2 to 7 psi. The spray thus produced has a low impact velocity when it contacts the boards, and it flows down the boards in the desired manner. The gentle sheeting flow has been found to be very important in producing reproducible results with the nitric acid etching chemistry. Preferred nozzles for use in this system include Series TF spiral nozzles from Bete Fog Nozzle, Inc., Greenfield, Massachusetts, and helix nozzles from Spraco, Inc., Nashua, New Hampshire. These nozzles are low impact, high flow, open cone nozzles.

The etching solution is delivered to the nozzles from a sump 41 by a low shear positive displacement pump 42. This type of pump is used in order to avoid degradation of the polymeric additive in the nitric acid etching solution. Such degradation has been found to be a serious problem with the centrifugal pumps employed in prior art spray etchers. The pumping action in such pumps produces high shear forces which rapidly degrade the polymeric additive.

A particularly preferred pump for use in this application is a variable speed rotary gear pump. In addition to avoiding shear in the pumping action, the variable speed pump eliminates the need for throttling valves to control the spray flow and pressure. Shearing action in such valves can also cause polymer degradation.

Although the variable speed gear pump is presently preferred for the reasons discussed above, any other low shear positive displacement pump can be employed. Other suitable pumps include progressive cavity pumps and peristaltic pumps. Even though they are positive displacement pumps, piston pumps and diaphragm pumps with check valves are not suitable for this application because the high shear orifices of the check valves would rapidly degrade the polymer.

Transfer chamber 29 is provided with a mist producing sprayer for rinsing the workpieces as they leave the etch chambers. This serves to stop the etching action immediately as the workpieces leave the etch chambers, to remove dissolved copper and other material from the workpieces, and to remove some of the gaseous by-products of the etching reaction before the workpieces enter the other rinsing chambers. The removal of the dissolved copper reduces the dissolved copper load on waste water treatment from the system, and the removal of the gaseous by-products reduces the by-product load on the external ventilation system to which the reactor is connected.

With a nitric acid etching solution, the by-products of the reaction between nitric acid and copper include nitrogen dioxide ($NO_2$) and other nitrogen oxides ($NO_x$), and the preferred rinsing solution in this situation is water. Much of the $NO_2$ and the other nitrogen oxides are adsorbed by the water to form nitric acid. The effluent from the spray is collected in a sump 43 and returned to etchant sump 41 to replenish the water which evaporates from the etching solution during normal use. Thus, $NO_x$ emissions are reduced and etching chemical utilization is increased at the same time.

Rinsing chambers 31, 32 are similar to the corresponding chambers in the prior art embodiment of FIG. 1, with a single sump 44 being provided for these two chambers. The rinse water is recirculated in chamber 31, and clean rinse water is used in the final rinsing chamber 32.

The reactor has exhaust vents 46, 47 at the entrance and exit ports, as do other reactors currently in use. An additional exhaust vent 48 is located toward the exit end of rinsing chamber 31, and this serves as the main gas vent for the system. Vents 46, 47 assure total containment of the etchant vapor, but only a small fraction of the total gas effluent passes through them. All three of the vents are connected to an external exhaust system (not shown) which has standard gas scrubbing equipment for removing the gaseous by-products from the exhaust gas stream. Locating the main exhaust vent in the second rinsing chamber causes virtually all of the by-product gases from the etching reaction to pass through the water spray where they are removed. This in situ scrubbing significantly reduces the amount of such gasses which must be processed in the external exhaust system.

To insure that the gaseous by-products of the etching reaction follow the desired path toward exhaust vent 48, air is introduced into the entrance side of etch chamber 27 at a pressure somewhat higher than the pressure in the etch chambers. This creates a gas flow from this chamber to the main exhaust vent and encourages the gaseous by-products to pass through the rinse water.

Operation and use of the reactor, and therein the method of the invention, in removing copper from printed circuit boards with a nitric acid etching solution is as follows. The boards are introduced into the reactor through entrance port 26 and conveyed in an upright or vertical position. As the boards pass through etch chambers 27, 28, they are sprayed with a gentle spray of the etching solution in relatively large drops, and the etching solution runs down the boards in a gentle sheeting flow. The trapezoidal pattern of spray nozzles 38 sprays more of the etchant on the upper portions of the boards as they enter the chambers to provide more uniform etching over the vertical surfaces as the etchant runs down the boards.

When the boards leave the etch chambers and enter rinsing chamber 29, they still have a substantial amount of the etching solution on them. The water spray in this chamber removes the remaining etchant and thereby stops the etching reaction. The water spray also removes dissolved copper from the boards and brings down much of the gaseous $NO_x$ produced by the etching reaction. A substantial portion of the $NO_2$ and other nitrogen oxides combine with the water to produce nitric acid. The effluent from this chamber is collected in sump 43 and supplied to etchant sump 41 to replenish water which evaporates from the etching solution.

The boards receive additional washing as they travel through rinsing chambers 31, 32, and they are dried in drying chamber 33 before leaving the reactor through exit port 34.

As noted above, substantially all of the gas venting occurs through the main exhaust vent 48 which is located toward the exit end of rinsing chamber 31. With this arrangement, virtually all of the gaseous by-products from the etch reaction have to pass through a water spray, and most of these by-product gases are removed from the vent gas stream by the water spray before it leaves the reactor. The vents 46, 47 at the entrance and exit ports insure total containment of the etchant vapor, but the gas which is exhausted through these vents is only a small fraction of the total gas effluent stream.

It is apparent from the foregoing that a new and improved vertical spray etcher and method have been provided. While only certain presently preferred embodiments have been described in detail, as will be apparent to those familiar with the art, certain changes and modifications can be made without departing from the scope of the invention as defined by the following claims.

We claim:

1. In a reactor for removing copper from a generally planar workpiece by reaction with an etching solution containing nitric acid, a polymer and a surfactant: means for conveying the workpiece in a generally upright position, an etch chamber through which the workpiece is conveyed, a plurality of low impact, large drop producing nozzles positioned to direct the etching solution onto the workpiece to provide a gentle sheeting flow of the etching solution down the workpiece as the workpiece passes through the etch chamber, a first rinsing chamber having means for spraying a workpiece emerging from the etch chamber with a rinsing solution to remove etching solution and dissolved copper from the workpiece and to adsorb by-product gases from the etching reaction, a second rinsing chamber through which the workpiece travels for further rinsing after leaving the first rinsing chamber, and an exhaust outlet in the second rinsing chamber for exhausting gases from the reactor after said gases have passed through the first rinsing chamber and the second rinsing chamber.

2. The reactor of claim 1 wherein the nozzles in the etch chamber are arranged in a pattern which directs a greater quantity of the etching solution onto the upper portion of the workpiece as the workpiece enters the etch chamber.

3. The reactor of claim 2 wherein the nozzles are arranged in a trapezoidal pattern with more nozzles toward the upper edge of the workpiece than toward the lower edge.

4. The reactor of claim 1 including a low shear positive displacement pump for delivering the etching solution to the nozzles in the etch chamber.

5. The reactor of claim 1 including means for collecting rinsing solution which has been used in the first rinsing chamber and replenishing the etching solution with the collected rinsing solution.

6. The reactor of claim 1 including means for introducing air into the etch chamber at a pressure greater than the pressure in the chamber to promote movement of gaseous by-products from the etching reaction toward the exhaust vent.

7. In a reactor for removing copper from a generally planar workpiece with an etching solution containing nitric acid, a polymer and a surfactant: an etch chamber, means for conveying the workpiece through the chamber in a generally upright position, a plurality of low impact, large drop producing nozzles arranged in a pattern with a greater number of nozzles toward the upper edge of the workpiece for directing the etching solution onto the workpiece to provide a gentle sheeting flow of the etching solution down the workpiece as the workpiece passes through the etch chamber, and a low shear positive displacement pump for delivering the etching solution to the nozzles.

8. The reactor of claim 7 wherein the nozzles are arranged in a generally trapezoidal pattern.

9. In a reactor for removing metal from a generally planar workpiece by reaction with a liquid etching solution: means for conveying the workpiece in a generally upright position, an etch chamber with means for spraying the workpiece with the etching solution as the workpiece travels through the chamber, a first rinsing chamber having means for spraying a workpiece emerging from the etch chamber with a rinsing solution to remove etching solution and dissolved metal from the workpiece and to adsorb by-product gases from the etching reaction, a second rinsing chamber through which the workpiece travels for further rinsing after leaving the first rinsing chamber, and an exhaust outlet in the second rinsing chamber for exhausting gases from the reactor after said gases have passed through the first rinsing chamber and the second rinsing chamber.

10. The reactor of claim 9 including means for collecting rinsing solution which has been used in the first rinsing chamber and replenishing the etching solution with the collected rinsing solution.

11. The reactor of claim 9 including means for introducing air into the etch chamber at a pressure greater than the pressure in the chamber to promote movement of gaseous by-products from the etching reaction toward the exhaust vent.

12. In a process for removing copper from a generally planar workpiece by reaction with an etching solution containing nitric acid, a polymer and a surfactant, the steps of: conveying the workpiece in a generally upright position successively through an etch chamber and first and second rinsing chambers, effecting a gentle sheeting flow of the etching solution down the workpiece as the workpiece passes through the etch chamber, spraying the workpiece in the first rinsing chamber with a rinsing solution to remove etching solution and dissolved copper from the workpiece and to adsorb by-product gases from the etching reaction, effecting further rinsing of the workpiece in the second rinsing chamber, and exhausting gases from the second rinsing chamber after said gases have passed through the first rinsing chamber and the second rinsing chamber.

13. The process of claim 12 wherein the gentle sheeting flow is effected by spraying the etching solution onto the workpiece in the form of low impact, large drops.

14. The process of claim 12 wherein a greater quantity of the etching solution is applied to the upper portion of the workpiece than to the lower portion.

15. The process of claim 14 wherein the etching solution is sprayed onto the workpiece in a generally trapezoidal pattern.

16. The process of claim 12 wherein the gentle sheeting flow is effected by spraying the etching solution onto the workpiece through low impact nozzles, and the etching solution is delivered to the nozzles by low shear positive displacement pump.

17. The process of claim 16 wherein the etching solution is delivered to the nozzles at a pressure on the order of 2 to 7 psi.

18. The process of claim 12 including the step of collecting rinsing solution which has been used in the first rinsing chamber and replenishing the etching solution with the collected rinsing solution.

19. The process of claim 12 including the step of introducing air into the etch chamber at a pressure greater than the pressure in the chamber to promote movement of the gaseous by-products from the etching reaction toward the second rinsing chamber.

20. In a process for removing copper from a generally planar workpiece with an etching solution containing nitric acid, a polymer and a surfactant, the steps of: conveying the workpiece in a generally upright position through an etch chamber, and effecting a gentle sheeting flow of the etching solution down the workpiece as the workpiece passes through the chamber.

21. The process of claim 20 wherein the gentle sheeting flow is effected by spraying the etching solution onto the workpiece in the form of low impact, large drops.

22. The process of claim 20 wherein a greater quantity of the etching solution is applied to the upper portion of the workpiece than to the lower portion.

23. The process of claim 22 wherein the etching solution is sprayed onto the workpiece in a generally trapezoidal pattern.

24. The process of claim 20 wherein the gentle sheeting flow is effected by spraying the etching solution onto the workpiece through low impact nozzles, and the etching solution is delivered to the nozzles by low shear positive displacement pump.

25. The process of claim 24 wherein the etching solution is delivered to the nozzles at a pressure on the order of 2 to 7 psi.

26. In a process for removing metal from a generally planar workpiece by reaction with a liquid etching solution, the steps of: conveying the workpiece in a generally upright position successively through an etch chamber and first and second rinsing chambers, spraying the workpiece with the etching solution as the workpiece travels through the etch chamber, spraying the workpiece emerging from the etch chamber with a rinsing solution in the first rinsing chamber to remove etching solution and dissolved metal from the workpiece and to adsorb by-product gases from the etching reaction, rinsing the workpiece further in the second rinsing chamber, and exhausting gases from the second rinsing chamber after said gases have passed through the first rinsing chamber and the second rinsing chamber.

27. The process of claim 26 including the steps of collecting rinsing solution which has been used in the first rinsing chamber and replenishing the etching solution with the collected rinsing solution.

28. The process of claim 26 including the step of introducing air into the etch chamber at a pressure greater than the pressure in the chamber to encourage movement of the gaseous by-products from the etching reaction toward the second rinsing chamber.

* * * * *